(12) United States Patent
Ondricek et al.

(10) Patent No.: US 6,887,723 B1
(45) Date of Patent: May 3, 2005

(54) METHOD FOR PROCESSING AN INTEGRATED CIRCUIT INCLUDING PLACING DICE INTO A CARRIER AND TESTING

(75) Inventors: Douglas S. Ondricek, Lafayette, CA (US); David V. Pederson, Scotts Valley, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/260,794

(22) Filed: Mar. 1, 1999

Related U.S. Application Data

(63) Continuation-in-part of application No. 09/205,502, filed on Dec. 4, 1998.

(51) Int. Cl.[7] .................. G01R 31/26; H01L 21/66; H01L 21/44; H01L 21/18; H01L 21/50
(52) U.S. Cl. .................. 438/14; 438/108; 438/117; 438/121
(58) Field of Search ................ 438/15, 108, 117, 438/14, 121; 324/500; 700/39, 115

(56) References Cited

U.S. PATENT DOCUMENTS

| | | | |
|---|---|---|---|
| 3,407,925 A | 10/1968 | Ruehlemann | |
| 3,982,159 A | 9/1976 | Dennis et al. | |
| 4,293,175 A | 10/1981 | Cutchaw | |
| 4,330,163 A | 5/1982 | Aikens et al. | |
| 4,417,777 A | 11/1983 | Bamford | |
| 4,765,471 A | 8/1988 | Murphy | |
| 4,804,130 A | 2/1989 | Kwan et al. | |
| 4,899,107 A | 2/1990 | Corbett et al. | 324/705 |
| 4,906,194 A | 3/1990 | Grabbe | |
| 5,045,975 A | 9/1991 | Cray et al. | |
| 5,055,777 A | 10/1991 | Bonelli et al. | |
| 5,106,309 A | 4/1992 | Matsuoka et al. | |

(Continued)

FOREIGN PATENT DOCUMENTS

| | | |
|---|---|---|
| JP | 3142847 | 6/1991 |
| JP | 04-080672 | 3/1992 |
| JP | 05-036792 | 2/1993 |
| JP | 08-179006 | 7/1996 |
| JP | 08-213794 | 8/1996 |
| JP | 10-197598 | 7/1998 |
| TW | 83209948 | 1/1995 |
| WO | WO 98/01906 | 1/1998 |

OTHER PUBLICATIONS

Jarvela, "Module Holder And Actuator", IBM Technical Disclosure Bulletin, vol. 16 No. 12, pp. 3975–3976, May 1974.

*Primary Examiner*—William M. Brewster
(74) *Attorney, Agent, or Firm*—Blakely Sokoloff Taylor & Zafman; N. Kenneth Burraston

(57) ABSTRACT

Methods for processing at least one die which comprises an integrated circuit. In one example of a method of the invention, an identification code is applied to a carrier. A singulated die is deposited into the carrier which holds the singulated die. The singulated die comprises an integrated circuit. The identification code may be applied to the carrier before or after depositing the singulated die into the carrier. The carrier may be used in testing the singulated die and may include a plurality of singulated die or just one singulated die. In another example of a method of the invention, an identification code is applied to a die. The die is deposited into a carrier which holds the die. The die comprises an integrated circuit, and the carrier holds the die in singulated form. Typically the die is placed in the carrier without any packaging which may protect the die. The identification code may be applied to the die before or after it is deposited into the carrier.

29 Claims, 14 Drawing Sheets

U.S. PATENT DOCUMENTS

| | | | |
|---|---|---|---|
| 5,131,535 A | * | 7/1992 | O'Connor et al. .......... 206/329 |
| 5,176,525 A | | 1/1993 | Nierescher et al. |
| 5,195,237 A | | 3/1993 | Cray et al. |
| 5,278,447 A | | 1/1994 | Vongfuangfoo et al. |
| 5,359,285 A | | 10/1994 | Hashinaga et al. ......... 324/158 |
| 5,366,380 A | | 11/1994 | Reymond |
| 5,455,390 A | | 10/1995 | DiStefano et al. |
| 5,476,211 A | | 12/1995 | Khandros |
| 5,495,667 A | | 3/1996 | Farnworth et al. |
| 5,500,605 A | | 3/1996 | Chang |
| 5,528,825 A | | 6/1996 | Miyauchi et al. |
| 5,541,525 A | | 7/1996 | Wood et al. |
| 5,561,594 A | | 10/1996 | Wakefield |
| 5,565,008 A | | 10/1996 | Shigetomo et al. |
| 5,599,194 A | | 2/1997 | Ozawa et al. |
| 5,635,832 A | * | 6/1997 | Ito et al. .................. 324/158.1 |
| 5,644,249 A | | 7/1997 | Kister |
| 5,646,816 A | | 7/1997 | Alden et al. |
| 5,648,893 A | | 7/1997 | Loo et al. |
| 5,653,599 A | | 8/1997 | Stratas |
| 5,686,842 A | | 11/1997 | Lee |
| 5,742,487 A | | 4/1998 | Kobayashi et al. ........... 36/809 |
| 5,772,451 A | | 6/1998 | Dozier, II et al. |
| 5,783,461 A | | 7/1998 | Hembree |
| 5,807,104 A | | 9/1998 | Ikeya et al. |
| 5,829,128 A | | 11/1998 | Eldridge et al. |
| 5,848,702 A | | 12/1998 | Pakeriasamy |
| 5,863,814 A | | 1/1999 | Alcoe et al. |
| 5,932,891 A | | 8/1999 | Higashi et al. |
| 5,949,242 A | * | 9/1999 | Wood et al. ................. 324/760 |
| 5,998,864 A | | 12/1999 | Khandros et al. |
| 6,031,282 A | | 2/2000 | Jones et al. |
| 6,033,935 A | | 3/2000 | Dozier, II et al. |
| 6,064,218 A | | 5/2000 | Godfrey et al. |
| 6,078,500 A | | 6/2000 | Beaman et al. |
| 6,078,845 A | * | 6/2000 | Friedman .................... 700/104 |
| 6,087,845 A | | 7/2000 | Wood et al. |
| 6,147,316 A | * | 11/2000 | Beffa ......................... 209/573 |
| 6,181,567 B1 | | 1/2001 | Roemer et al. |
| 6,184,699 B1 | * | 2/2001 | Smith et al. ................. 324/762 |
| 6,219,908 B1 | * | 4/2001 | Farnworth et al. ............ 29/833 |
| 6,264,533 B1 | * | 7/2001 | Kummeth et al. ............. 451/8 |
| 6,275,052 B1 | | 8/2001 | Hembree et al. |
| 6,292,003 B1 | | 9/2001 | Fredrickson et al. |
| 2002/0004320 A1 | | 1/2002 | Pedersen et al. |

\* cited by examiner

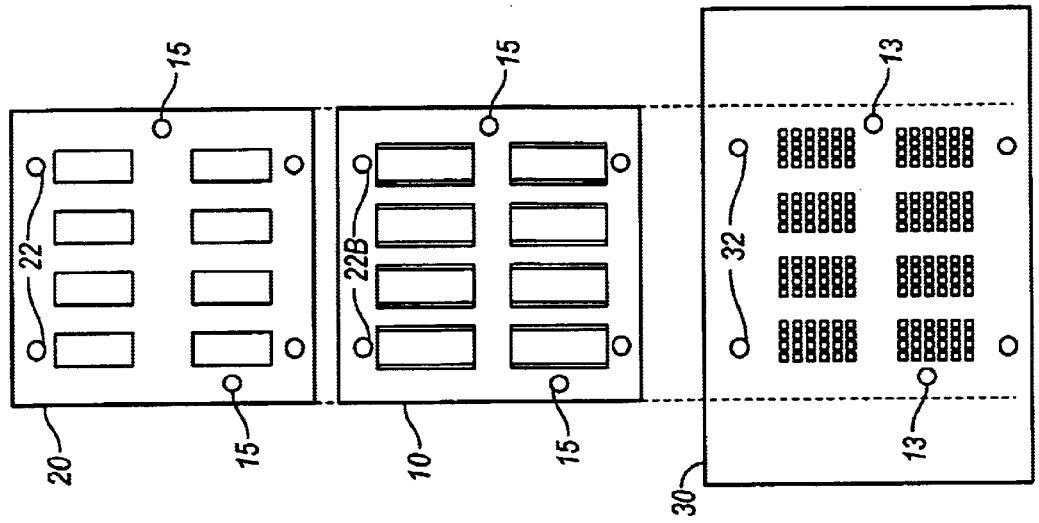
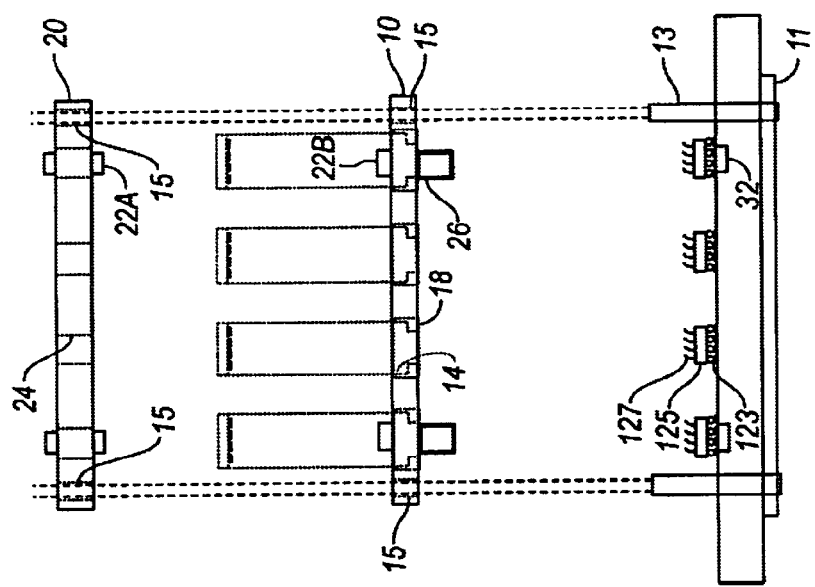

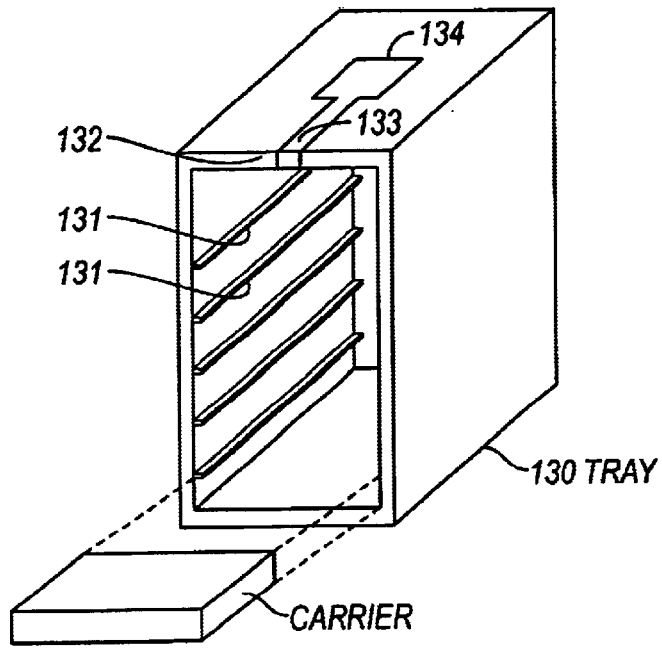
FIG. 13C
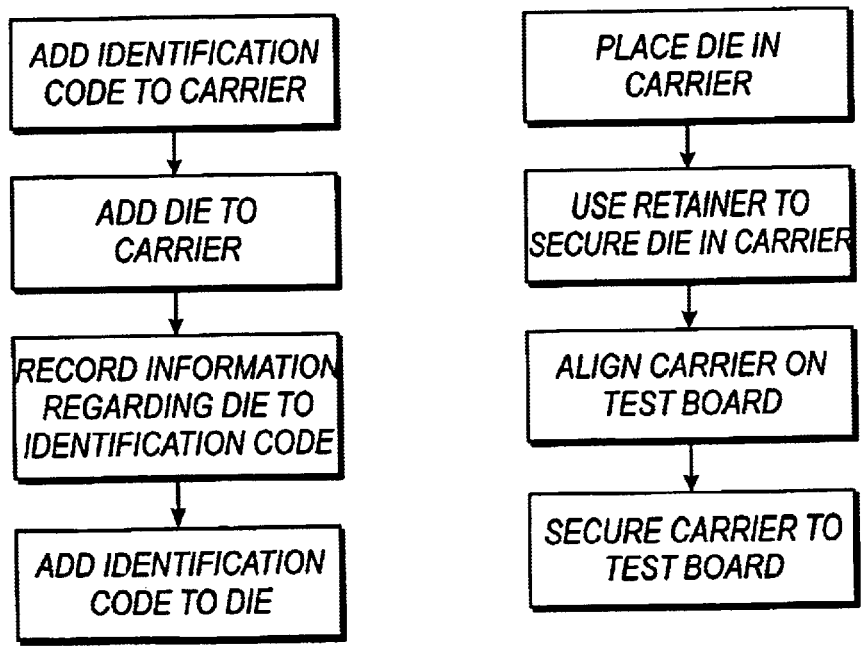
FIG. 14
FIG. 15

METHOD FOR PROCESSING AN INTEGRATED CIRCUIT INCLUDING PLACING DICE INTO A CARRIER AND TESTING

RELATED APPLICATION

This application is a continuation-in-part of co-pending, commonly assigned U.S. patent application Ser. No. 09/205,502, filed Dec. 4, 1998, entitled "Socket for Mating with Electronic Component, Particularly Semiconductor Device with Spring Packaging for Fixturing, Testing, Burning-In." That application is incorporated herein in full by reference.

BACKGROUND OF THE INVENTION

This application is related to the patent application titled "Method for Mounting an Electronic Component" and to the patent application titled "Method for Processing an Integrated Circuit" which are being filed concurrently herewith.

1. Field of the Invention

The present invention relates in general to electronic assemblies and the testing thereof. More specifically, the present invention relates to a method and apparatus for the transport and handling of die from an original wafer to a test board, a printed circuit board, and/or a final product substrate.

2. Description of Related Art

The subject of chip scale packaging has been the focus of intense study in the industry for many years. One very promising technology involves securing small, resilient members onto a suitable substrate and using these members to effect contact between an active device and other circuitry. Methods are known for making such resilient interconnection elements used for microelectronics, and for fabricating spring contact elements directly on semiconductor devices. A particularly useful resilient interconnection element comprises a free standing spring contact element secured at one end to an electronic device and having a free end standing away from the electronic device so as to readily contact a second electronic device. See, for example, U.S. Pat. No. 5,476,211, entitled "Method for Manufacturing Electrical Contacts, Using a Sacrificial Member."

A semiconductor device having spring contact elements mounted thereto is termed a springed semiconductor device. A springed semiconductor device may be interconnected to an interconnection substrate in one of two principal ways. It may be permanently connected, such as by soldering the free ends of the spring contact elements to corresponding terminals on an interconnection substrate such as a printed circuit board. Alternatively, it may be reversibly connected to the terminals simply by urging the springed semiconductor device against the interconnection substrate so that a pressure connection is made between the terminals and contact portions of the spring contact elements. Such a reversible pressure connection can be described as self-socketing for the springed semiconductor device. A discussion of making semiconductors with spring packaging (MicroSpring™ contacts) is found in U.S. Pat. No. 5,829,128, issued Nov. 3, 1998, entitled "Method of Mounting Resilient Contact Structures to Semiconductor Devices." A discussion of using and testing semiconductors with MicroSpring™ contacts is disclosed in U.S. patent application Ser. No. 09/205,502, filed Dec. 4, 1998, entitled "Socket for Mating with Electronic Component, Particularly Semiconductor Device with Spring Packaging, for Fixturing, Testing, Burning-In or Operating Such a Component", and assigned to the assignee of the present invention.

The ability to remove a springed semiconductor device from a pressure connection with an interconnection substrate would be useful in the context of replacing or upgrading the springed semiconductor device. A very useful object is achieved simply by making reversible connections to a springed semiconductor device. This is also useful for mounting, temporarily or permanently, to an interconnection substrate of a system to burn-in the springed semiconductor device or to ascertain whether the springed semiconductor device is measuring up to its specifications. As a general proposition, this can be accomplished by making pressure connections with the spring contact elements. Such contact may have relaxed constraints on contact force and the like.

In a typical manufacturing process, a wafer is subjected to limited testing to identify gross functionality or non-functionality of individual components on the wafer. The functional individual semiconductor components or die are then packaged for further burn-in and more comprehensive testing. The packaging process is both expensive and time consuming.

Using the MicroSpring contacts for interconnects provides fully testable die while still on the wafer. One preferred method of testing the die is to singulate them, then move them through a more or less typical test flow as is currently performed on packaged devices. A key difference is that the die are already packaged once singulated from the wafer, but current testing equipment is not adapted for use with such devices.

To achieve this, a chip level part or IC die could be placed into a carrier once it is diced from the original wafer. The carrier could then transport the die to the test board for burn-in tests, for example. Once all die in the carrier pass inspection, the carrier could then be used to transport and mount the die onto the printed circuit board or final product substrate.

Such a carrier would be particularly useful for die which include MicroSpring contacts, or similar contacts. Such a carrier also would be useful for traditional die for making contact with a test apparatus or final product that includes a suitable connection mechanism. A test apparatus or final product including MicroSpring contacts would be particularly useful for connecting to traditional die.

A chip level carrier would provide several advantages over the art. First, an individual die would be tested and could be replaced if it failed testing. Second, a chip level carrier could incorporate a tracking mechanism that could track each individual die, storing relevant information on the carrier for monitoring and tracking. Third, a chip level carrier allows for easy handling of numerous dies and protects the dies and their spring contacts during transportation, storage and use. Further, a carrier could limit the amount of compression the spring contacts on the die under test underwent, which may be less than the compression allowed during subsequent primary use of the die. The limitation of the compression could be achieved through design decisions to determine a maximum allowable compression for the spring contacts during the testing phase. Then, different limits can be adopted for actual use. This feature would increase the "travel" life of the spring.

SUMMARY OF THE INVENTION

The present invention relates to methods for processing at least one die which comprises an integrated circuit.

In one example of a method of the invention, an identification code is applied to a carrier. A singulated die is deposited into the carrier which holds the singulated die. The singulated die comprises an integrated circuit. The identification code may be applied to the carrier before or after depositing the singulated die into the carrier. The carrier may be used in testing the singulated die and may include a plurality of singulated die or just one singulated die.

In another example of a method of the invention, an identification code is applied to a die. The die is deposited into a carrier which holds the die. The die comprises an integrated circuit, and the carrier holds the die in singulated form. Typically the die is placed in the carrier without any packaging which may protect the die. The identification code may be applied to the die before or after it is deposited into the carrier.

BRIEF DESCRIPTION OF THE DRAWINGS

The invention is further described by way example with reference to the accompanying drawings, wherein:

FIGS. 12B and 12C illustrate side and top views of a test board including springs, and a corresponding carrier, cover and die.

FIG. 13C is a perspective view showing a tray for multiple carriers.

FIG. 14 is a flowchart illustrating the steps involved in tracking a carrier and/or singular die through manufacturing, transport, and final use.

FIG. 15 is a flowchart illustrating the steps involved in fabricating and then utilizing the present invention.

DETAILED DESCRIPTION OF THE INVENTION

A method and apparatus for manipulating an integrated circuit (IC) die through testing and a final application is described. A method and apparatus for tracking the die is disclosed. In the following detailed description, numerous specific details are set forth in order to provide a more thorough understanding of the present invention. However, it will be obvious to one skilled in the art that the present invention may be practiced without these specific details. In other instances, well-known devices, methods, procedures, and individual components have not been described in detail so as not to unnecessarily obscure aspects of the present invention.

The present invention provides a carrier for use in transporting and tracking IC die through testing after they have been cut from the original wafer. The carrier of the present invention is generally used to transport and support the die during testing, and may be labeled to allow for the tracking of both the carrier and its individual components. The carrier of the present invention may be used with die having either soldered spring, pin-in-hole spring, or pressure spring contacts. Once testing is complete, the carrier may then be transported and mounted on a printed circuit board to form a final substrate package.

The carrier may be used with die having no springs at all, for interfacing with test or final application products that include suitable contact mechanisms for establishing electrical contact with the die. One preferred test product includes resilient, free-standing contact elements, much like the springs on silicon described in detail in this application. One preferred final application product includes similar springs.

Figure 1A:
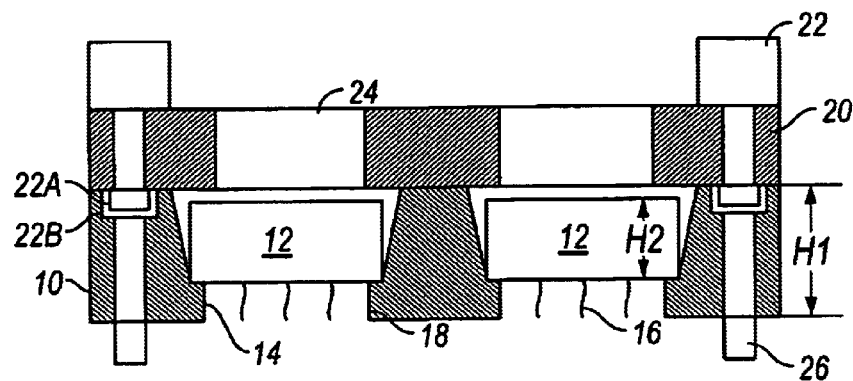
FIG. 1A is a cross-sectional illustration of a carrier module of the present invention comprising a carrier supporting a die with a cover securing the die within the carrier.

A general embodiment of the present invention is illustrated in FIG. 1A. The carrier, or lower component, 10 is used to support the die 12 during the transport, testing, and/or final application use of the die 12. The carrier 10 is typically made of an organic material such as polymer and may be formed using injection molding. In one preferred embodiment, epoxy glass laminate material is cut to size and machined to a desired form. The die 12 is placed into the carrier 10 through the opening 14 where it resides on ledge 18 lining at least a portion of the base of the opening 14.

Note the walls of opening 14 preferably are chamfered to allow for an easy insertion of the die 12 into the opening 14. Also, note that the die is placed into the carrier before packaging the die. That is, there is no package that surrounds and protects the die. After testing in the carrier 10, the carrier may serve as the final package for the die 12.

The spring components 16 of the die 12 extend downward through the opening 14 to allow for future electrical contact with the contact pads of either a test board, a printed circuit board, or a final application substrate package. The spring components 16 extend through the opening 14 past the lower side of the ledge 18. The spring components or contacts 16 are generally elongate resilient electrical contact elements. A detailed discussion of such resilient electrical contact elements is found in U.S. Pat. No. 5,864,946, entitled "Method of Making Contact Tip Structures", issued Feb. 2, 1999, to Eldridge et al., assigned to the assignee of the present invention, and is incorporated herein by reference.

Note that the height H=H1−H2 provides the maximum compression limit for the spring components 16. H1 is the dimension from the bottom of carrier 10 to the bottom of cover 20, which is the location of the top of the die when the springs are under compression. H2 is the thickness of the die. Another factor to consider is that in certain geometries, the springs will contact terminals that are raised above some contact surface and thus come within the opening 14. In this instance, the thickness of the terminal must be considered in determining the minimum spring length under maximum compression.

In other words, the springs cannot be compressed more than the height H. In general, there are three spring component heights that are particularly noteworthy—1) new product or resting height (e.g., 30 mils), 2) the burn-in height for testing (e.g., 28 mils), and 3) the operating height (e.g., 25 mils). It is preferred to compress the springs as little as possible during testing so as to preserve spring life, that is, to maintain resilience for best performance in later operation. In other words, increased compression of the spring components is desired for final operation to ensure a good electrical contact, and minimal compression before the final operation.

Figure 1C:
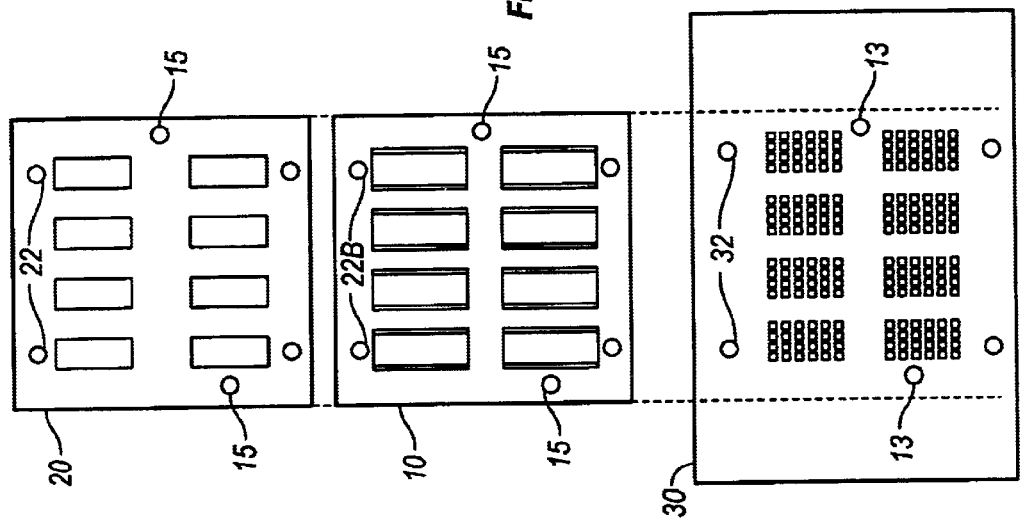
FIGS. 1B and 1C illustrate one particularly preferred embodiment of the invention.
Figure 1B:
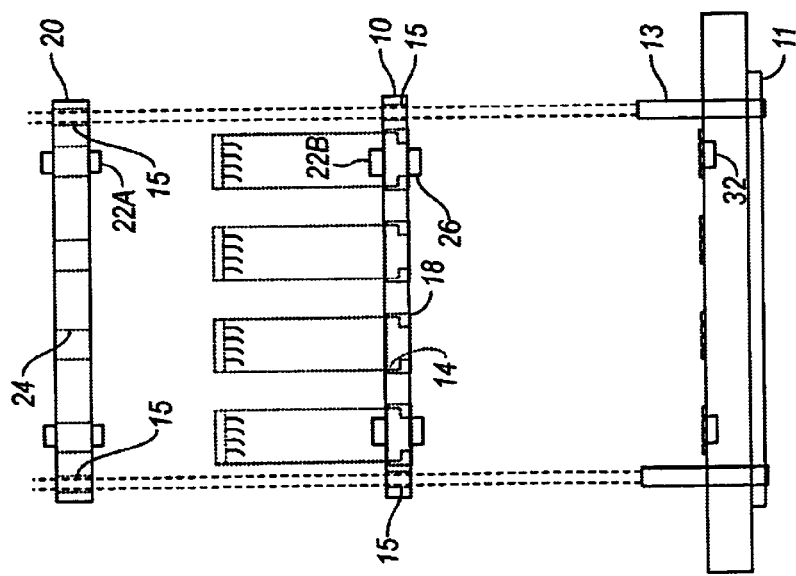
Figure 1D:
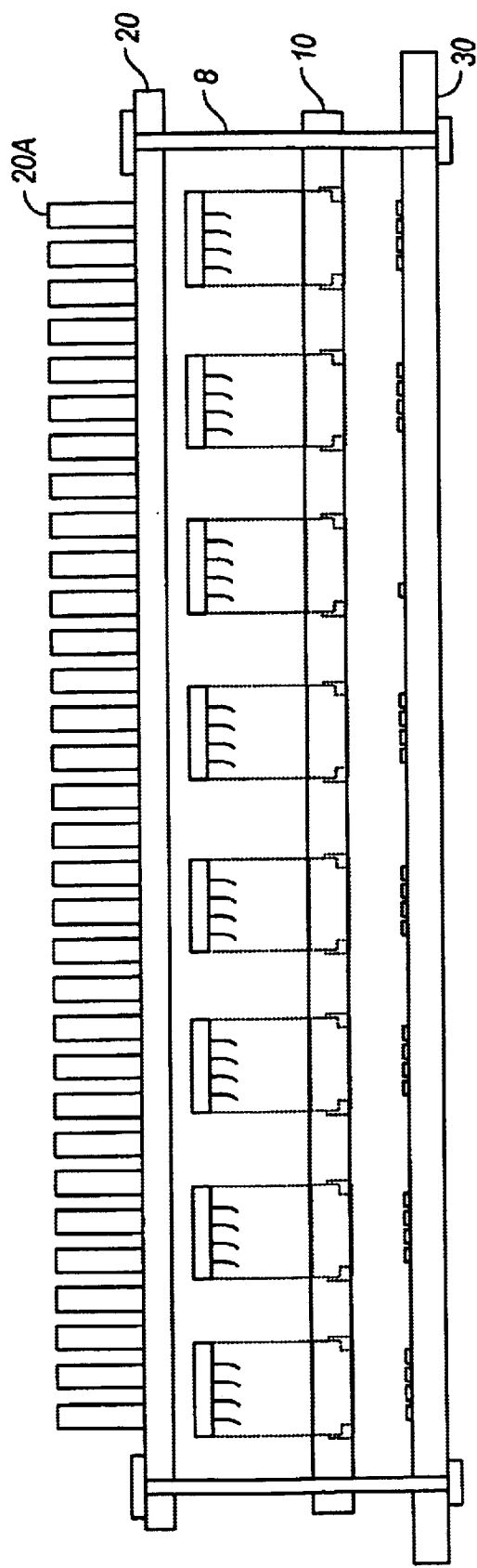
FIG. 1D illustrates another particularly preferred embodiment of the invention.

FIGS. 1B and 1C illustrate exploded side and top views of the apparatus of FIG. 1A. These show a 2 by 4 arrangement of die, with a cover 20 with corresponding openings. FIG. 1D shows another preferred embodiment of the present invention. This shows a one by 8 arrangement of eight die, carrier 10, cover 20, and heat radiating elements 20A. In this exploded view, securing pins 8 are shown exaggerated in length to illustrate the exploded view. In practice, securing pins 8 would be of a length to hold cover 20 securely in place against carrier 10, with carrier 10 secured against board 30.

Figure 2A:
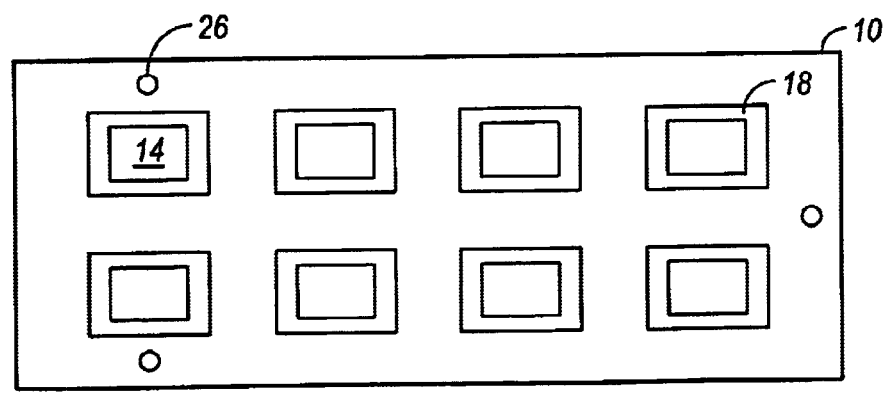
FIG. 2A is a top view of one embodiment of the carrier of the present invention.
Figure 2B:
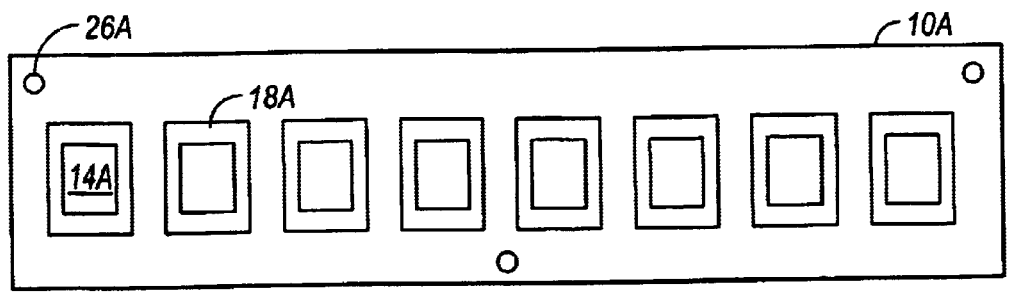
FIG. 2B is a top view of a second embodiment of the carrier of the present invention.

FIGS. 2A and 2B illustrate top views of the carrier 10, showing two examples of possible arrangements of the openings 14 in the carrier 10. FIG. 2A is an illustration of a carrier 10 (corresponding with the cross-sectional view of carrier 10 shown in FIG. 1A) having eight openings arranged in two rows of four openings 14 each. FIG. 2B is an alternate arrangement, wherein eight openings 14a are positioned in the carrier 10a (this top view does not directly correspond with the cross-sectional view of FIG. 1A) in a single linear row. Note that although both FIGS. 2A and 2B depict a carrier 10 having eight openings 14 arranged in a linear fashion, this is not a requirement of the invention. Instead, the actual number, position, and orientation of the openings 14 in the carrier 10 is a design choice dependent on numerous factors.

Referring back to FIG. 1A, a cover (or lid, etc.) 20 is coupled to the carrier 10. As with the carrier, the cover 20 may be formed from an organic material using injection materials. In one preferred embodiment, the cover is machined from epoxy glass laminate. The cover may also be comprised of a metallic sheet to assist in heat dissipation, and may have added heat dissipation components, such as fins, mounted thereon. The cover may be considered a retaining element. Note that any retaining element such as snap locks, ball bearings, retainers, a single bar, etc. may be used in addition to a cover to secure the die within the carrier. Such retaining elements will typically be positioned to mechanically abut a portion of a backside surface of the die when the die is placed in the carrier.

Figure 5:
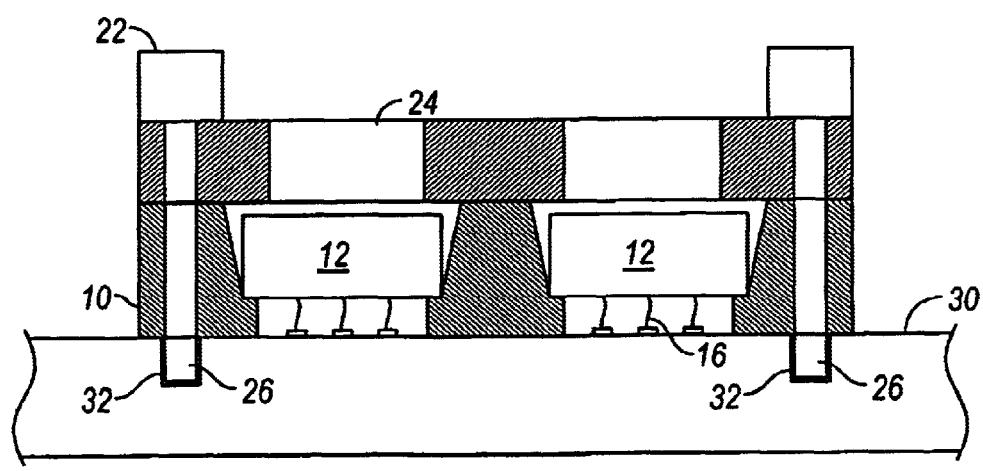
FIG. 5 is a cross-sectional view of the embodiment of the present invention illustrated in FIG. 1A mounted on a test board and using stand-offs.
Figure 6A:
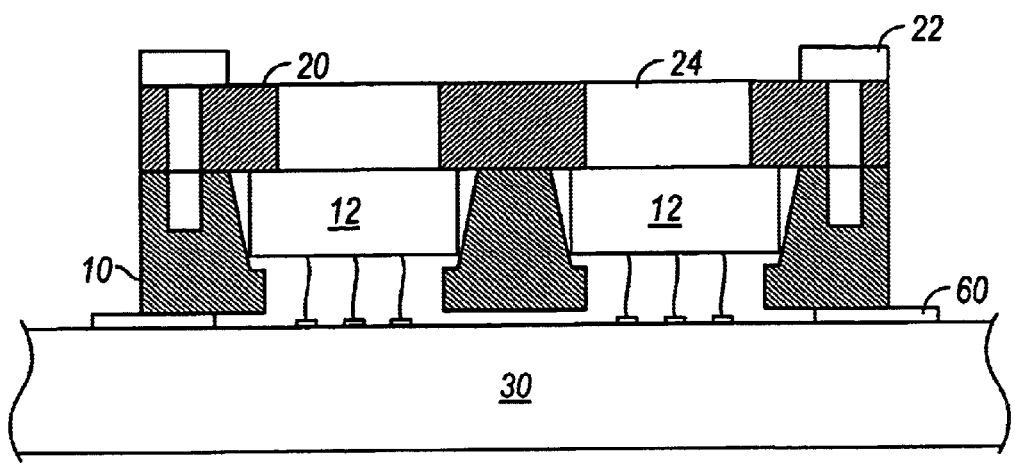
FIG. 6A is cross-sectional view of an alternative embodiment of the present invention mounted on a test board and using shims.
Figure 6B:
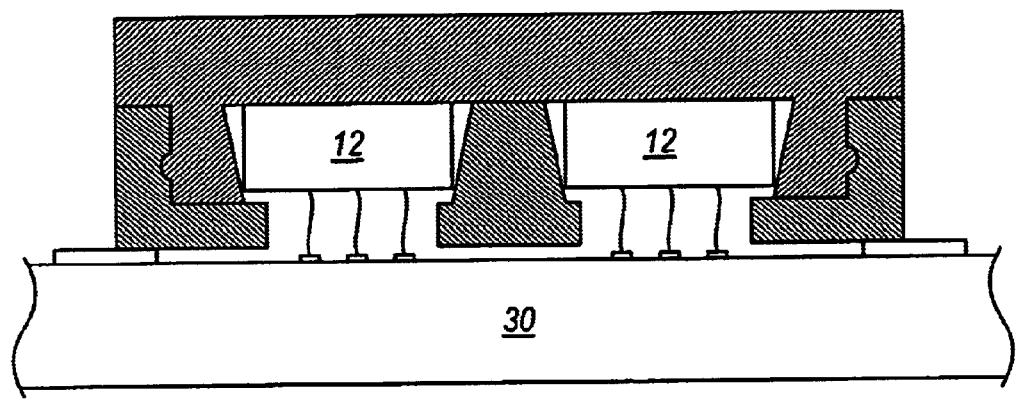
FIG. 6B is a cross-sectional view of an alternative embodiment of the present invention mounted on a test board and using shims.

The cover 20 serves two primary functions. First, the cover 20 is used to secure the die 12 in the opening 14 of the carrier 10 during transport. Second, the cover 20 provides resistance against the backside of the die 12 when the die 12 is under compression during testing or use. This compression arises from the force of the springs pushing against the die 12 and the underlying substrate, such as test board 30 (see FIG. 5). The cover 20 may be coupled to the carrier 10 in any one of several mechanical coupling regimes. Illustrated in FIG. 1A, is snap shell 22B and snap head 22B. Snap head 22A is secured to cover 20 by rivet 22. However, a nut and bolt or a clamp can also be used. FIGS. 5 and 6B include an illustration of another alternative embodiment using a variation of a snap lock to secure the two components together. The method of coupling the carrier 10 and the cover 20 is not significant other than to ensure that it is a temporary connection, which is useful in most (but not all) instances of the invention. A temporary connection allows the cover 20 to be removed at some future time, for example to remove die 12 after testing or use, or to allow a particular die 12 to be removed and replaced or to allow the cover 20 itself to be replaced.

Figure 3A:
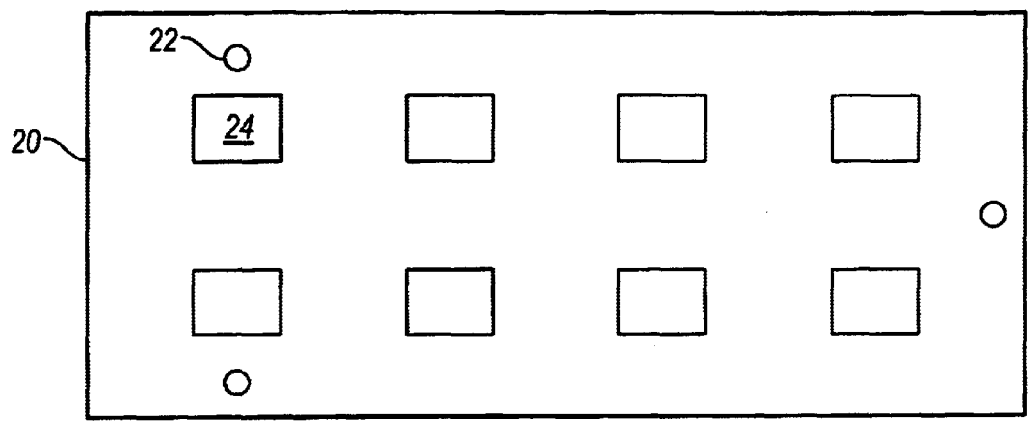
FIG. 3A is a top view of one embodiment of a cover of the present invention having holes therein.
Figure 3B:
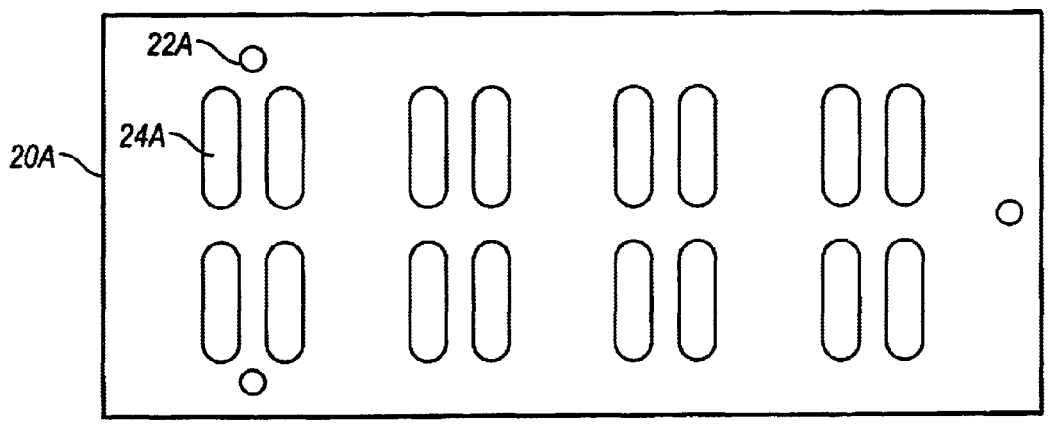
FIG. 3B is a top view of a second embodiment of a cover of the present invention having holes therein.

The cover 20 also may comprise openings 24 that expose a portion of the backside of the die 12. In FIG. 1A, a single opening 24 exposing the majority of the backside of the die 12 located such that it is approximately over the center of both the die 12 and carrier opening 14 is shown. FIG. 3A provides a top view of the cover 20 showing the rectangular openings 24 positioned over each of the die 12. Note, however, that the openings 24 are not required to be either rectangular or singular over each die. For example, FIG. 3B illustrates one possible alternative embodiment of the cover 20a, wherein there are two oval openings 24a over each of the die 12 in the carrier 10.

Although the cover 20 is not required to have openings and may be a solid sheet of material, the openings provide several advantages to the carrier of the present invention. First, the openings 24 allow a temperature-controlled gas to be delivered directly to the backside of the die 12. During burn-in testing, a temperature-controlled gas assists in maintaining a constant, desired temperature. Primarily, this allows the temperature of the die 12 to be modified so the performance can be evaluated at different operating temperatures. A hot gas could be delivered directly to the backside of the die 12 as needed for testing purposes. Second, the openings 24 allow additional couplings to be made to the die under test. For example, a thermocouple could be used to monitor the temperature of each die, or other couplings could be used to take measurements, such as resistance, during testing or operation. Third, the openings 24 provide access to the backside of each die 12 allowing an identification mark ID to be added as needed (see FIG. 13). For example, the die 12 could be marked with an ink dot to indicate failure of the test. A part could be marked to show the results of testing, such as directly marking a speed grading. Product identification information such as the manufacturer, lot number and the like can be applied. Additionally, a bar code or other machine readable code could be imprinted on the back of each die to allow for tracking of each die 12 or a magnetic strip with a code could be placed on the die. (See tracking discussion below for more detail.)

Referring back to FIG. 1A, the snap used to couple the carrier 10 and cover 20 also serves to provide a stand off 26. In one preferred example, the stand off 26 is part of the fastener securing snap 22B to carrier 10. A stand off can be designed into or otherwise secured to housing 10.

Figure 4:
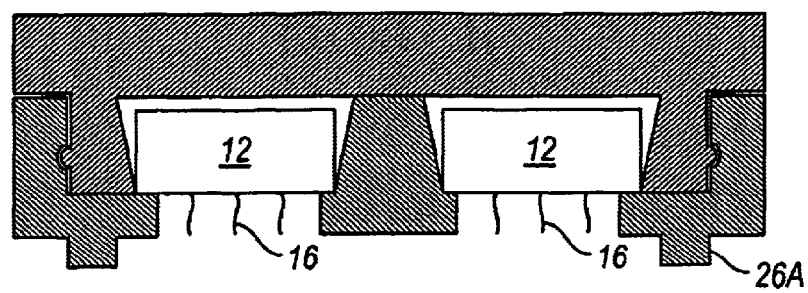
FIG. 4 is cross-sectional view of an alternative embodiment of the carrier module of the present invention comprising a carrier supporting die with a cover snap-locked to said carrier and securing said die within said carrier.

The stand off 26 extends from the base of carrier 10 down lower than the spring components 16 and serves to provide protection for the spring components 16 during transfer, storage or handling. For example, if the carrier 10 were set down on a flat surface prior to testing, the stand off 26 would prevent the spring components 16 from being compressed. Note that if a method of coupling the carrier 10 and cover 20 other than a snap and rivet 22 as shown in FIG. 1A is used, for example use of a screw that does not extend all the way through the two components or use of a snap lock, a stand off may be added to or fabricated as part of the carrier during the manufacturing process. FIG. 4 illustrates use of such a fabricated standoff to provide protection for the springs when using a snap lock to couple the carrier and cover.

The standoffs also provide a very significant second function by assisting in correctly positioning the carrier onto a board. During testing, the carrier 10 will be mounted on a test board 30 as shown in FIG. 5. The spring components 16 will be placed into contact with contact pads 31 on the test board 30. When mounting the carrier 10 onto the test board 30, it is thus important to ensure that each spring component 16 is lined up with and in contact with a contact pad 31 on the board 30. To accomplish this, positioning holes 32 in the test board 30 are coordinated with the stand offs 26. In this manner, when the carrier 10 is mounted on the board 30 and the stand offs 26 reside within the positioning holes 32, the spring components 16 are in contact with the contact pads 31 on the upper surface of the board 30. In the case of the embodiment of FIG. 5, a test board 30 may have holes 32 that are shallower than holes on a final substrate that is part of the final package of the die. In this way, the springs are compressed less in testing than in final use. As may be seen in FIGS. 2A and 2B, in one preferred embodiment, three or more positioning holes and corresponding stand offs are used in such a manner as to allow only one correct alignment and fit. Note that although only three stand offs 26 are shown in FIGS. 2A and 2B, more could easily be added as needed. In a particularly preferred embodiment, illustrated in FIGS. 1B and 1C, two offset positioning holes are sufficient to align the pins. Alignment pins 13 are secured to bolster plate 13 on one side of board 30. Holes 15 in the carrier and cover are aligned with alignment pins 13. With a moderate offset, it is easy for an operator to align the carrier correctly. Although the carrier could be inserted on the opposing alignment pins, the carrier would be obviously off-alignment with the fixture, and thus it is easy to set the alignment correctly.

Figure 1E:
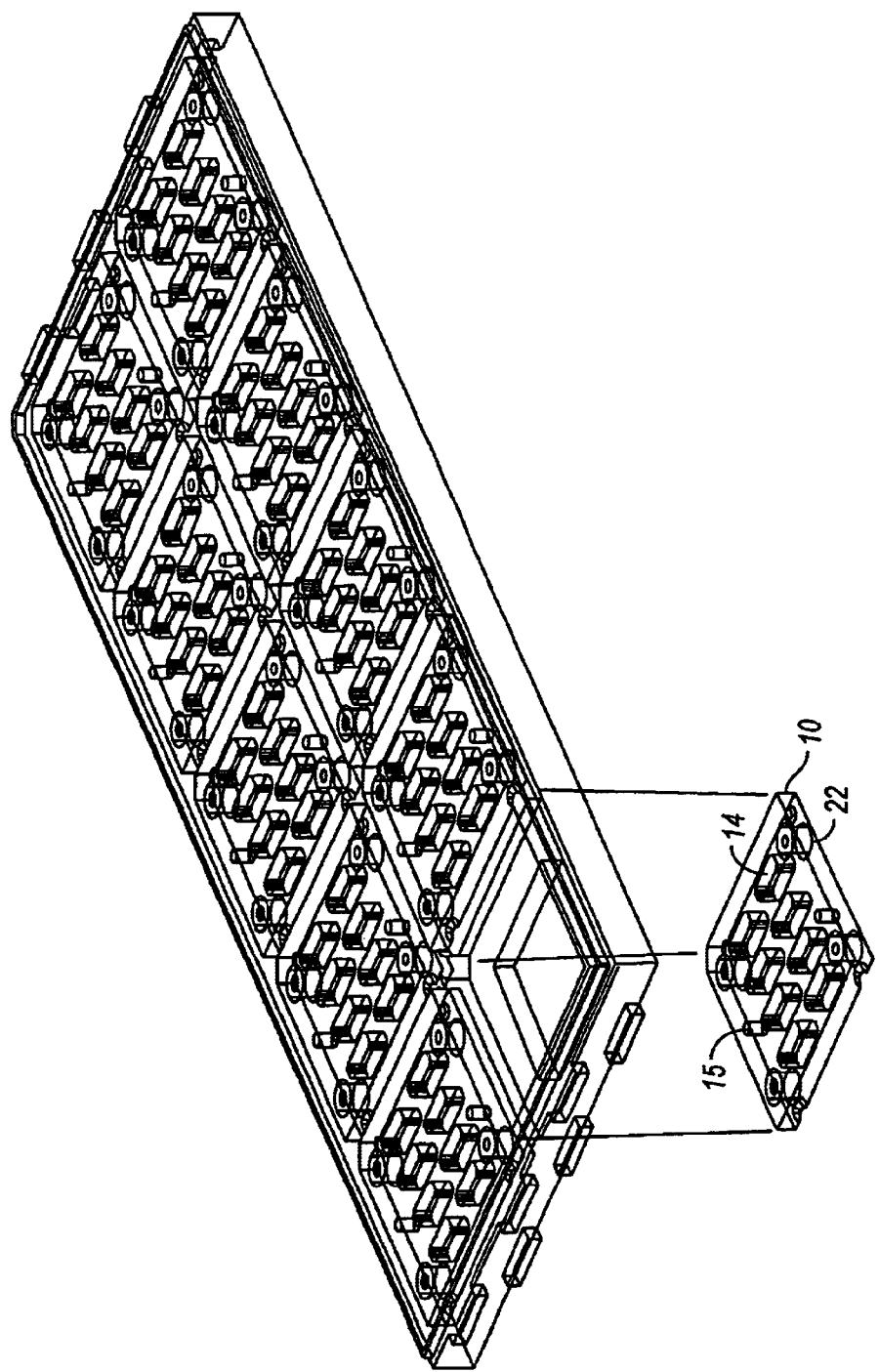
FIG. 1E illustrates a JEDEC tray containing nine carriers, with a tenth oriented to be added to the tray.

FIG. 1E shows a standard JEDEC tray with 9 carriers in slots and one slot open. A carrier 10 is shown ready to insert into the tray.

Although the use of stand offs is preferred, the present invention is not limited to use with stand offs. For example, as shown in FIGS. 6A and 6B, shims 60 may be used to prevent the spring components from being compressed to the maximum limit. The shims may be used during testing but not during use of the die to compress the springs less during testing than use. When using the shims 60 instead of stand offs, alternative means are required to assist in the positioning and lining up of the carrier when mounted on the board. For example, standard alignment techniques such as split beam optics can be used to identify the positions of the springs and the terminals and to bring them together in precise alignment.

Figure 7:
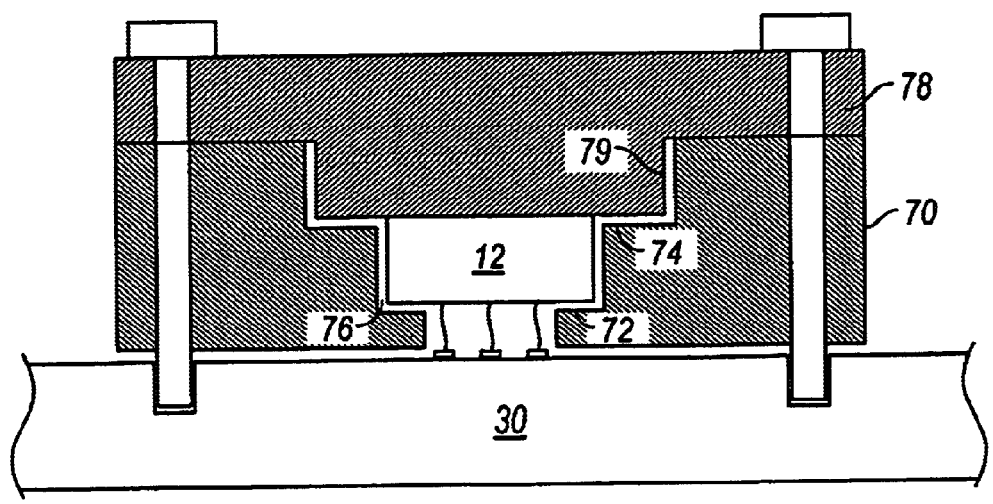
FIG. 7 is a cross-sectional view of another embodiment of the present invention wherein the carrier has two ledges within each opening and the cover has an added component extending down into the opening to secure the die within the carrier.

A second embodiment of the present invention is illustrated in FIG. 7. In this second embodiment, the carrier 70 has both a first ledge 72 and a second ledge 74 lining opening 76. The die 12 is lowered through the opening 76 and is supported by the first ledge 72. The cover 78 has an extended component 79 that fits down into opening 76 and resides against the second ledge 74. In this manner, the component 79 serves to secure the die 12 in the carrier 70 and provides resistance to the compressive force exerted against the spring contacts of the die 12. Note, however, that this embodiment could be further modified such that an actual second ledge was not required and instead the extended component 79 would reside against the back surface of the die 12. In one embodiment of the invention, different corners having extended components with different heights may be used to cause the springs to be compressed less in testing than in use.

Figure 8:
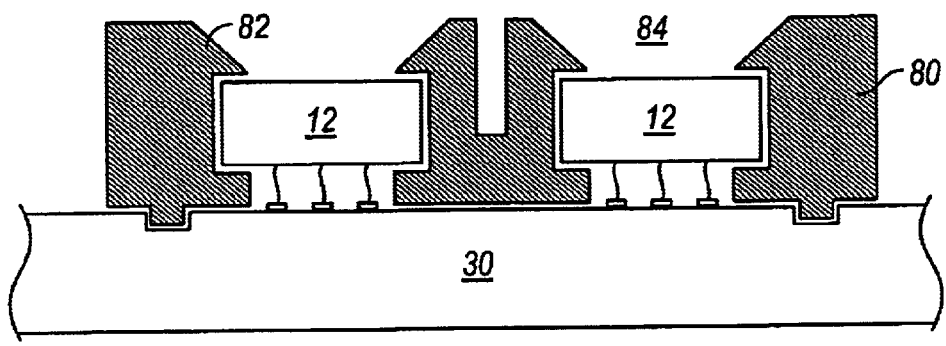
FIG. 8 is a cross-sectional view of an alternative embodiment of the present invention wherein the carrier itself secures the die in place through use of snap locks rather than a cover.

A third embodiment of the present invention is illustrated in FIG. 8. FIG. 8 illustrates a carrying apparatus having merely a carrier with no cover. Instead, the carrier 80 has spring locks 82 that secure the die 12 within the opening 84. The spring locks are a form of a retainer that is coupled to the carrier. As the die 12 is lowered into the opening 84, the spring locks widen to allow the die 12 to pass through. Once the die 12 is completely lowered into the opening 84, the spring locks 82 return to their original position and lock the die 12 into place. The spring locks can be held in an "open" position by handling equipment to allow easy passage of a die into the carrier, then moved to a "closed" position to maintain the die in place. This embodiment of the present invention is advantageous in that it eliminates several parts and steps of the manufacturing process. However, because the backside of the die 12 is not fully supported, when a compressive force is exerted, the silicon die 12 may be subject to warpage and damage. The specific selection of test die, dimensions of the die, spring forces, strength of materials and the like will influence the suitability of this design for a given application.

Once each of the different embodiments has been positioned on the board, the carrier module (comprising the carrier, die, and cover) must be securely coupled to the board. This coupling can be achieved in any one of several ways. In many preferred embodiments, the coupling is not permanent so that the carrier module may be released and removed. Note that both individual and multiple carriers may be mounted on a board.

Figure 9A:
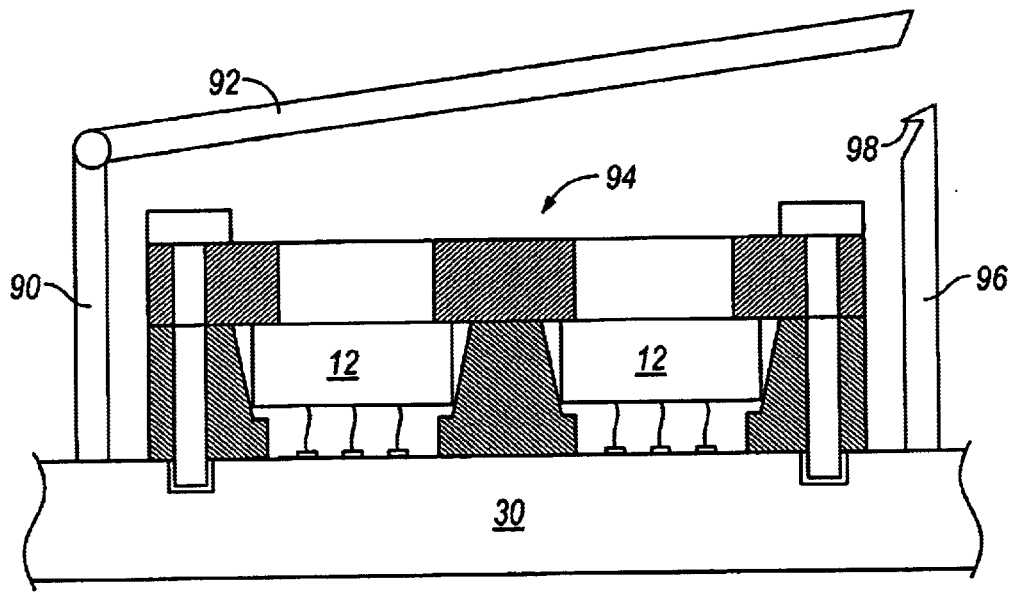
FIG. 9A is a cross-sectional view illustrating a method of clamping the carrier module of the present invention to a board by lowering an arm across the back of the board.

One preferred embodiment for coupling the carrier module to the board, is a clamshell such as the one depicted in FIG. 9A. A support 90 resides at one edge of the board. A hinged arm 92 extends from the support 90 and across the backside of the carrier module 94. Once the carrier module has been positioned on the board 30, the arm 92 is lowered such that it lays across the back of the carrier module 94. Once the arm 92 is lowered, it snaps into place with a second support arm 96 on an opposite side of the carrier module 94 that has a receiving snap lock 98 that then holds the arm 92 secure. The size of the arm 92 relative to the carrier module 94 and the number of such arms used is purely a design decision dependent primarily on the size of the carrier module 94. As just one example, an arm 92 may secure a single carrier module 94 wile a different arm 92 may secure several carrier modules.

Figure 9B:
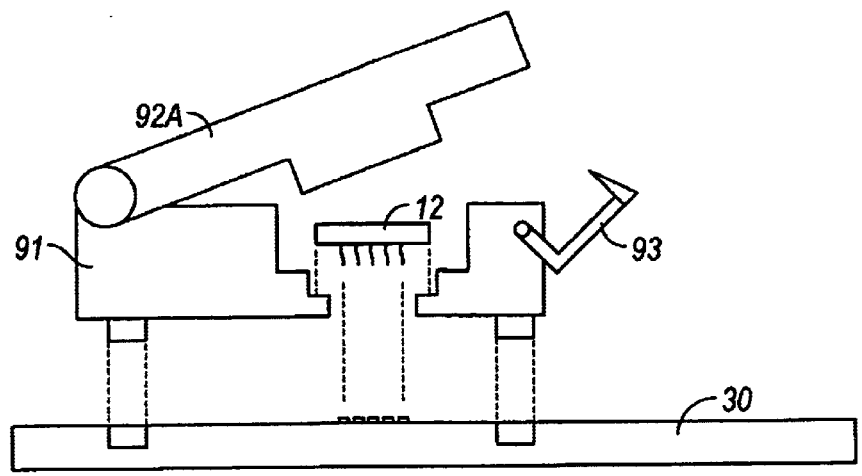
FIG. 9B is a cross-sectional view of another embodiment of the present invention wherein the carrier is secured to the load board by spring-loaded retaining arms.

Referring to FIG. 9B, a hinged cover secures a die in position against a load board. Housing 91 includes an opening for die 12, very much like the structure of the carrier discussed in detail above, for example in connection with FIG. 7. Top 92A is hinged to rotate and connect to housing 91. In the open position, it is easy to insert die 12. In the closed position, it serves to secure die 12. It may be secured in the closed position by latch 93. Housing 92 may be affixed to board 30 in a permanent or semi-permanent manner, as by screws from the opposite side of board 30 (not shown). This is particularly useful for testing limited quantities of die, as during early research phases.

Figure 9C:
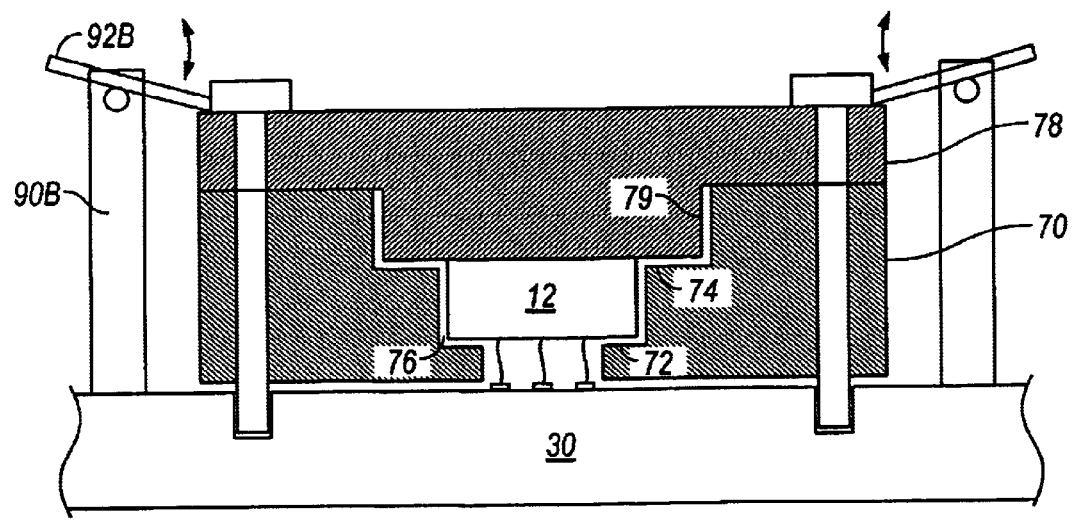
FIG. 9C is a cross-sectional view of another embodiment of the present invention wherein the carrier is secured to the load board by spring loaded, threaded bolts.
Figure 9D:
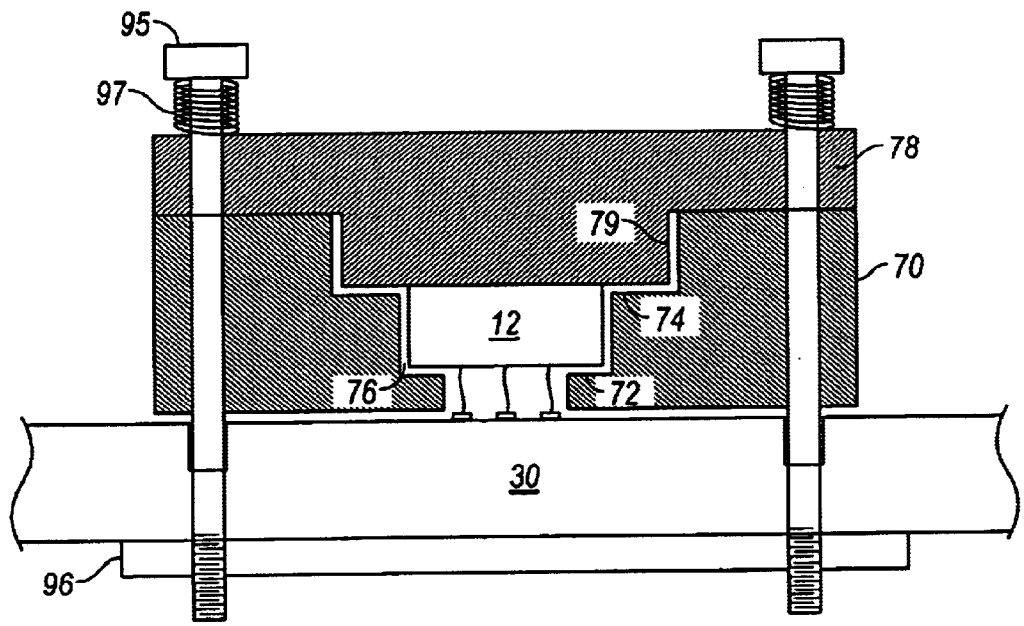
FIG. 9D illustrates one particularly preferred embodiment of the invention.

FIG. 9C illustrates another method of securing the carrier to the board. Each post 90B supports an arm 92B, which pivots against the carrier to secure it to the board 30. Arm 92B is under tension from torsion spring (not shown), which maintains pressure against the carrier. The spring force is sufficient to keep the carrier in position, but can be overcome by an operator positioning the carrier on the board.

Figure 10:
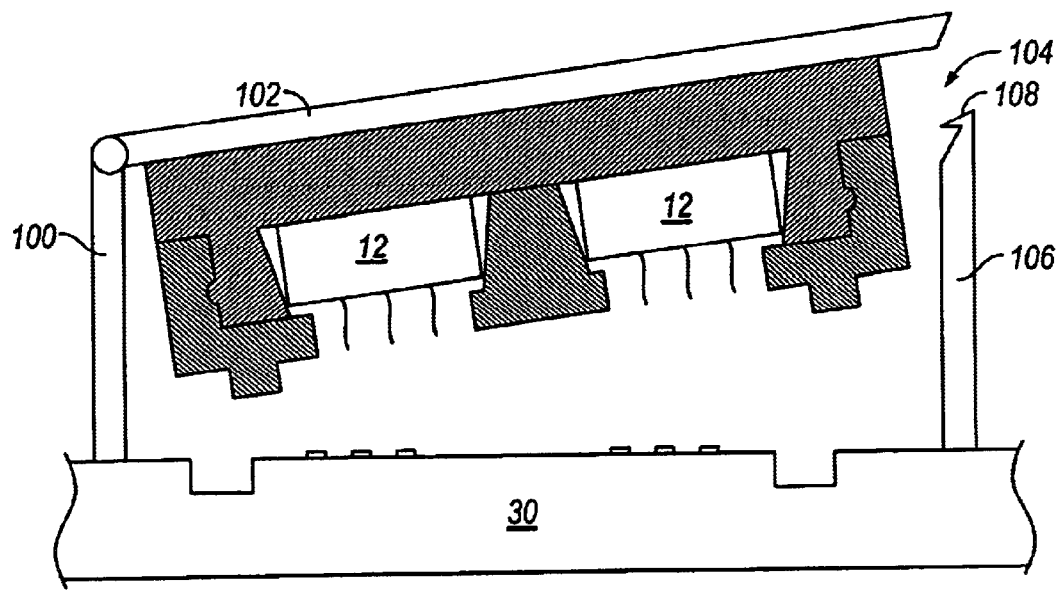
FIG. 10 is a cross-sectional view illustrating an alternative method of mounting the carrier module to the board, wherein the carrier module is mounted first on the arm and then lowered into place on the board.

As shown in FIG. 10, it is clear that the carrier module 104 does not first have to be positioned/mounted on the board 30. Instead, in one embodiment, the carrier module 104 may be mounted on the arm 102 itself (again by some non-permanent mechanical means) and then lowered until the carrier module 104 is in the correct position relative to the board 30 and the arm 102 is snapped into place and held secure by the snap lock 108 of the second support 106.

Figure 11:
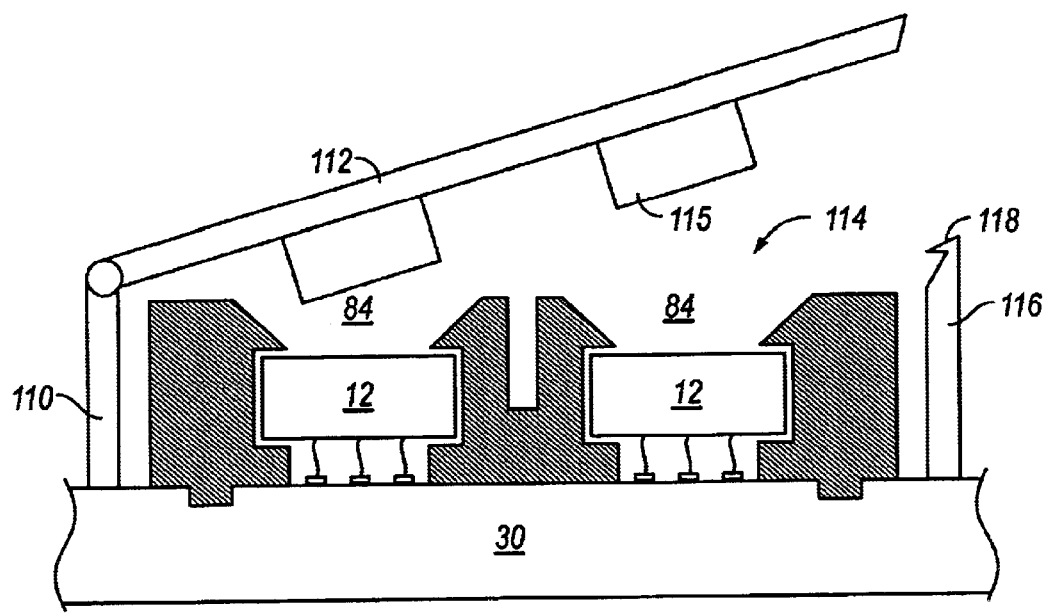
FIG. 11 is a cross-sectional view illustrating a method of mounting the carrier module illustrated in FIG. 8 to a board.

A modification on the above design may be used with the third embodiment discussed above and shown in FIG. 8 (i.e., a carrier using snap locks to secure the die rather than a cover). FIG. 11 shows an arm 112 having extending components 115 that fit into the opening 84. These extending components 115 provide the support and resistance required when the die is under compression that will prevent the die from becoming damaged due to warpage. As with the previous clamshells, the arm 112 is lowered until it snaps into place and is held secure by the snap lock 118 of the second support 116.

Another feature that may be incorporated in the various embodiments of the present invention allows the spring contacts to have a wiping action across the landing (or contact) pads as the carrier module is mounted on the test board. When making any connection between two electrical components, it is often advantageous to move one relative to another so that one makes sliding contact with the other. This tends to dislodge debris that might inhibit a good electrical connection. Thus, the ability to allow a wiping action with soldered springs during testing is a significant benefit.

During testing, a wiping action is typically inherently provided by a spring pressure connection, but not necessarily by springs for solder connection. Preferred spring shapes for pressure-connect springs include a geometry such that compression of the spring directly towards the supporting substrate (in the Z axis if the substrate is in the XY plane) causes the contact region of the spring to move laterally, that is, with an XY component. This leads to a wiping action across the face of a terminal, which typically is more or less planar. Preferred spring shapes for solder-connect springs or springs for pin-in-hole connection may not have much or any XY movement upon compression.

Figure 12A:
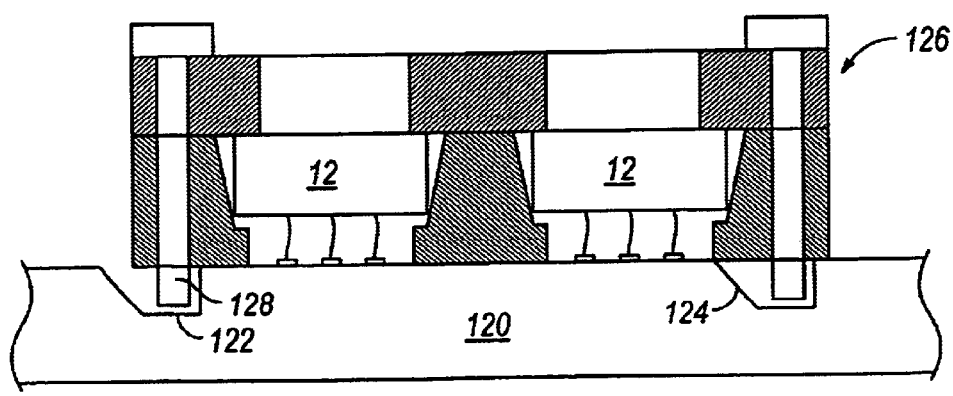
FIG. 12A is a cross-sectional view of a carrier module of the present invention wherein the positioning holes on the board having a sloping front edge such that the carrier module slides into place and creates a swiping action by the die's contact springs across the corresponding contact pad on the board.

One method of achieving a wiping action is illustrated in FIG. 12A. In this embodiment, the positioning holes 122 on the board 120 are modified slightly such that they have a sloping front edge 124. When the carrier module 126 is placed over the front edge 124 of the position holes 122 and lowered into position, the stand offs 128 slide down the sloping front edge 124 before coming to a secure rest in positioning hole 124. This sliding motion of the carrier module 126 causes the contact springs to wipe across the contact pads on the board 120. The wiping action results in a better final electrical connection between the contact springs and the contact pads.

An alternative embodiment (not shown) has a different positioning hole, with a pattern substantially in the plane of the board that allows for translation of the carrier relative to the board. As the carrier is brought into contact with the board, the carrier is moved within the positioning hole to create a wiping action. When using a handler to position the carriers, it is straightforward to program a lateral motion as part of the loading process.

Thus far, the discussion has centered on carriers for die where the die include springs. However, the same principles apply well to an apparatus and method where the test board, or a final packaging apparatus includes springed elements. Referring to FIGS. 12B and 12C, and comparing FIGS. 1B and 1C, load board 30A can be prepared with springs. One preferred way to position springs on such a board is described in detail in U.S. Pat. No. 5,772,451, entitled "Sockets for Electronic Components and Methods of Connecting to Electronic Components". That patent describes securing resilient contacts to a suitable substrate. The substrate can include contact such as solder balls opposite the springs, and in turn can be reflowed to connect to terminals on a substrate such as a printed circuit board. Using such component here, a substrate 125 can be prepared with springs 127 and positioned to contact terminals on semiconductor die as shown. One embodiment positions solder balls 123 on the side of the substrate 125 opposite the springs 127. The solder balls can be secured to terminals on the board, for example by reflowing. The springs can be brought into contact with die for testing or other operation of the die. When desired, a substrate 125 can be removed from the board for replacement, repair, or other purposes. Standoffs 26 are increased in height to set the correct spring tension during test. Correspondingly, if a similar carrier is to be used in final products, a springs connection such as that illustrated in FIG. 12B, can be provided, with suitable stand offs for proper connection.

The die can be placed in the carrier and managed as described in this disclosure generally. In this way, conventional die without springs can be manipulated, tested and used in very much the same ways as described above for die with springs.

Figure 13A:
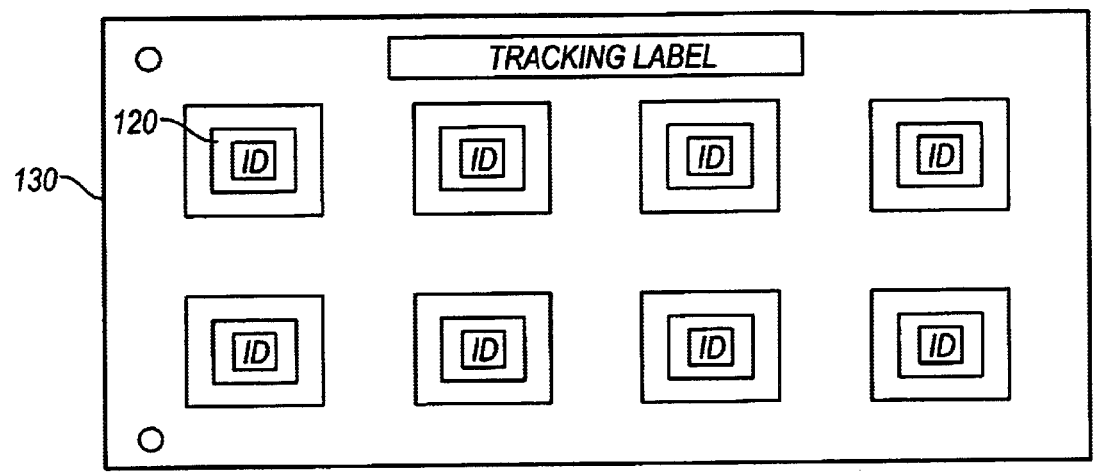
FIG. 13A is a top view of a carrier of the present invention further comprising a tracking label on the carrier and an identification mark on the die.

The present invention may be further improved upon through use of a tracking device. As shown in FIG. 13A, for example, a tracking mechanism may be added to the carrier 130. Optionally, an identification mark ID may be applied to the backside of the die 12 residing within the carrier 130. The ability to track a carrier and know at any given time the history of the die supported therein provides several advantages over the prior art. By placing a tracking label on the carrier and recording information concerning each die added to and/or removed from the carrier, at any given time a user can access the information on the die, including the particular wafer it came from and the specific manufacturing lot of wafers which included even the specific manufacturer. Although tracking abilities exist on the wafer level, no such ability is currently available on a die level. However, by placing a tracking label on the carrier of the present invention, information on the die level may be maintained.

Figure 13B:
FIG. 13B is an end view of a carrier of the present invention further comprising a tracking label on the carrier and a connection to an electronic storage device.

As shown in FIG. 13B, the tracking label may advantageously be placed on the side of the carrier so it is visible even when a cover is in place. In addition, as just one alternative method, the carrier may be fitted with a programmable device such as a EEPROM. Connections to a EEPROM are illustrated in FIG. 13B.

First, a tracking label or identification code is applied to the carrier (see FIG. 14 for flowchart). Note, however, that the tracking label may be applied to the carrier after the carrier is loaded with die. The wafer is diced. As each die is loaded into the carrier, information concerning that die is stored in a tracking label on the carrier. The information may include, but is not limited to, information identifying the specific wafer from which the die was created, information identifying a specific semiconductor wafer in a specific lot of wafers, information identifying a particular wafer processing lot in which the wafer was created, and the location of the die on the wafer. The tracking label may comprise a bar code or a code stored in a memory. device, such as a magnetic media or a semiconductor memory device, on the carrier.

This process is even more powerful in a particularly preferred embodiment. Wafer probing is performed as usual. Parts failing even basic testing are noted. For devices that are amenable to modification, the parts may be modified at this time. For example, many memory devices are manufactured with redundant sub-units. Preliminary testing identifies sub-units that are passing or failing and automated equipment can select an appropriate group of functional units so the device as a whole will function properly. Any amount of information can be tracked on these parts, from merely noting the failures to elaborate records on which units of which devices were found functional, and any other information that might be useful to manufacturing. As just one more example, in many manufacturing situations, test elements are fabricated in otherwise-unused portions of a semiconductor wafer. Such regions include scribe line regions, or unused portions near the edge of a wafer. Information about these test units can be maintained in a database together with information about devices found on the wafer.

The wide variety of process steps in the manufacture of semiconductors are likely to have some degree of variance in various regions of a wafer. Extreme care is take to minimize such variations, but to some extent parts in different regions of a wafer are likely to be slightly different. By tracking the identity of individual die as they are separated from the wafer and subjected to testing and other use, a wafer map can be reconstructed showing results of any desired test for a given die as well as its neighbors for any region of a wafer. Variations over lots of wafers can be detected and evaluated as well. Heretofore, such tracking has been at best extremely difficult as the identity of parts simply becomes too hard to monitor in a complex, high volume manufacturing environment.

This information can be extremely valuable for running a process in the fab. The information gleaned from testing is made available to the manufacturing floor as soon as practicable. In an automated system, thresholds can be established that trigger alarms for processes going out of specification, and the factory floor can be notified immediately. There are at least two major benefits in this feedback system when using the current system. First, since the wafers can be tested almost immediately after dicing, there is minimal delay from release from manufacturing to achieving first test results. This can be in only hours, although it often will be a small number of days, but this is compared to a minimum of several days and typically several weeks using current processes. The second big advantage is that by tracking the identity of each die, a wafer map can be reconstructed. Where test results show any sort of variation that is related to a position on the wafer, this information can be very valuable to the manufacturing floor in being certain that processes are consistent in all regions of the wafer during manufacturing. The rapid time response (quick feedback loop) is particularly valuable here in that early samples of a run can be evaluated and later lots of the same run can be modified where appropriate.

Turning to the preferred embodiment, after testing and initial device repair, automated equipment dices the wafer. Handling equipment places selected die into a carrier. Information about the specific location of a specific die on a specific wafer is tracked, as in a manufacturing database. For example, a group of eight die can be loaded into the carrier of FIG. 2A. By tracking the unique positions within the carrier, it is sufficient for the manufacturing database to track the carrier ID information, and the position of each die within the carrier.

The carrier can be marked in many ways, as noted above. One particularly preferred marking has a bar code or other machine readable code printed along the side of the carrier, in a position that can be read by automated handling and by operators even when a cover is over the carrier. Another particularly preferred marking includes a EEPROM device in the carrier. Automatic handling equipment can enter key information into the EEPROM. The equipment also can read information from the EEPROM. This might be as simple as a unique identification code, tied to the manufacturing database.

Groups of carriers can be positioned in a tray. A tray can be marked in much the same way as the carriers. Higher order organization is quite practical, as in organizing groups of trays in a cart. Depending on the number of die in a carrier, and the size of parts, a wafer may be singulated into die which fill carriers in some small number of trays, for example on the order of 5 to 10. Depending on the size of a production run, a lot of, for example, 25 wafers, then would occupy some 125 to 250 trays.

Referring to FIG. 13C, tray 130 may be fitted with a series of grooves 131, each of which can accommodate a carrier. A front edge of tray 130 includes label 132. The tray supports programmable device 134, suitably an EEPROM, with connection 133 readily accessible for contact by automatic handling equipment. Thus the label can be a guide for human operators, and machine-scannable, if desired. The programmable connection can allow access to an electronic tracking device.

An identification mark may also be applied to each die itself. Typically, such an identification mark would be applied to the backside of the die (the side opposite the spring contacts) after it was loaded into the carrier, wherein the mark was applied through an opening in the carrier or may be applied before the die is placed into the carrier. The identification mark on the die may comprise an ink dot indicating success or failure of a testing sequence, a unique or semi-unique identification number, a bar code retaining more specific information concerning the history of that particular die, or other useful information. As just one example, a series of die in a lot can be labeled with sequential, unique identification information. A separate lot may use the same identification information, but can be distinguished from the first lot by other means, such as time in the factory, some position in an external carrier, and the like. As a particular example, 16 bits of information may be used to track die within a lot, and some number of higher order bits might be used to identify larger groups of products.

The apparatus of the present invention may be compiled and used in a variety of manners (see flowchart of FIG. 15 for one example). For example, die may be loaded into a carrier and secured within the carrier by a retaining element to form a carrier module. This carrier module may then be positioned on a board and then secured down, for example by a clamp. Alternatively, the carrier module may be mounted on the clamp or coupling mechanism and then positioned on the board as it is secured/locked into place. Or, the carrier could first be mounted on the board and the die subsequently loaded and secured therein. Other variations on the steps followed in the compilation of the carrier module and its mounting on either a test board or a final substrate package exist. It is not required by the present invention, that a particular sequence of steps be followed in the compilation of the present invention.

We claim:

1. A method comprising:

depositing a plurality of singulated dice into a carrier, said carrier comprising a digital storage device;

mounting said carrier onto a substrate by inserting standoffs on said carrier into holes in a surface of said substrate, wherein said holes are sloped inducing a motion of said carrier as said standoffs are inserted into said holes, said motion comprising a horizontal component with respect to said surface of said substrate;

testing said singulated dice while deposited in said carrier; and storing in said digital storage device data indicating results of said testing of each of said dice.

2. A method as in claim 1 further comprising storing an identification code in said digital storage device, wherein said identification code comprises information identifying at least one semiconductor wafer from which said dice were singulated.

3. The method of claim 1 further comprising applying a die identification code to each of said singulated dice, each said die identification code comprising information relating to said die to which said die identification code is applied.

4. A method as in claim 3 wherein each said die identification code comprises information identifying the semiconductor wafer from which said die was singulated.

5. A method as in claim 4 wherein each said die identification code is applied to said die after said dice are deposited into and secured in said carrier.

6. A method as in claim 4 wherein each said die identification code further comprises information identifying a particular wafer processing lot in which the semiconductor wafer from which said die was singulated was created.

7. A method as in claim 5 wherein said die identification code is applied to said die through an opening in said carrier.

8. A method as in claim 1 wherein said testing comprises a burn-in testing.

9. A method as in claim 1 wherein said carrier secures said dice during use of said dice after said testing and said carrier acts as a final package for said dice.

10. A method as in claim 1 further comprising mounting a plurality of elongate, resilient electrical contact elements on contact pads of said dice.

11. A method as in claim 10 wherein said plurality of elongate, resilient electrical contact elements are mounted prior to depositing said dice into said carrier.

12. A method as in claim 1 further comprising applying a top on said carrier after depositing said dice into said carrier.

13. A method as in claim 10, wherein said substrate comprises electrical contact pads.

14. A method as in claim 1 wherein said carrier is mounted on said substrate prior to depositing said dice onto said carrier.

15. A method as in claim 1 wherein said carrier is mounted on said substrate after depositing said dice onto said carrier.

16. A method as in claim 13 wherein each of said contact pads on said dice are electrically coupled to a corresponding one of said plurality of electrical contact pads on said substrate through a corresponding one of said elongate, resilient electrical contact elements.

17. A method as in claim 16 wherein each of said elongate, resilient electrical contact elements is freestanding.

18. A method as in claim 10 wherein each of said elongate, resilient electrical contact elements is freestanding.

19. A method as in claim 1 wherein said substrate is a test printed circuit board which is used in said testing.

20. A method as in claim 1 wherein said substrate is a final package unit for said dice.

21. A method as in claim 1 wherein said substrate is used in said testing, and if said dice pass said testing, said substrate is used to package said dice for use.

22. A method as in claim 21 wherein if said dice fail said testing, said dice are removed from said carrier and other dice are deposited into said carrier.

23. A method as in claim 10 wherein each of said elongate, resilient electrical contact elements is compressed less during said testing than during final use of said dice.

24. A method as in claim 16 wherein each of said elongate, resilient electrical contact elements is compressed less during said testing than during final use of said dice.

25. A method as in claim 16 further comprising removing said dice from said carrier after said testing and packaging said dice for use.

26. A method as in claim 1 further comprising, for each of said plurality of dice, storing in said digital storage device data identifying a location on the semiconductor wafer from which said die was singulated.

27. A method as in claim 26 further comprising constructing using data stored in said digital storage device a map of a semiconductor wafer from which at least two of said dice were singulated indicating a location on said wafer of each of said dice and an indication of whether each said die passed or failed said testing.

28. A method as in claim 1 wherein each said die comprising a plurality of elongate contacts, said carrier comprising at least one opening through which said elongate contacts extend.

29. The method of claim 1, wherein said horizontal component of said motion of said carrier causes first contact elements on said plurality of singulated dice to wipe a surface of second contact elements on said substrate, wherein said surface of said second contact elements is generally parallel to said surface of said substrate.

* * * * *